(12) United States Patent
Hiatt

(10) Patent No.: US 7,791,207 B2
(45) Date of Patent: *Sep. 7, 2010

(54) PASS THROUGH VIA TECHNOLOGY FOR USE DURING THE MANUFACTURE OF A SEMICONDUCTOR DEVICE

(75) Inventor: William M. Hiatt, Charlotte, NC (US)

(73) Assignee: Micron Technology, Inc., Bosie, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/396,583

(22) Filed: Mar. 3, 2009

(65) Prior Publication Data

US 2009/0194886 A1 Aug. 6, 2009

Related U.S. Application Data

(60) Division of application No. 11/732,356, filed on Apr. 3, 2007, now Pat. No. 7,498,260, which is a continuation of application No. 10/925,796, filed on Aug. 24, 2004, now Pat. No. 7,199,050.

(51) Int. Cl.
H01L 23/48 (2006.01)
(52) U.S. Cl. .................. 257/774; 257/E23.06
(58) Field of Classification Search ............. None
See application file for complete search history.

(56) References Cited

U.S. PATENT DOCUMENTS

| | | |
|---|---|---|
| 5,138,434 A | 8/1992 | Wood et al. |
| 5,229,647 A | 7/1993 | Gnadinger |
| 5,714,794 A | 2/1998 | Tsuyama et al. |
| 5,714,802 A | 2/1998 | Cloud et al. |
| 5,818,698 A | 10/1998 | Corisis |
| 6,198,168 B1 | 3/2001 | Geusic et al. |
| 6,320,253 B1 | 11/2001 | Kinsman et al. |
| 6,379,982 B1 | 4/2002 | Ahn et al. |
| 6,441,494 B2 | 8/2002 | Huang et al. |
| 6,723,577 B1 | 4/2004 | Geusic et al. |
| 7,129,112 B2 | 10/2006 | Matsuo |
| 7,199,050 B2 | 4/2007 | Hiatt |

*Primary Examiner*—W. David Coleman
(74) *Attorney, Agent, or Firm*—Michael E. Romani

(57) ABSTRACT

Via structures are described which pass through a semiconductor substrate assembly such as a semiconductor die or wafer and allows for two different types of connections to be formed during a single formation process. One connection passes through the wafer without being electrically coupled to the wafer, while the other connection electrically connects to a conductive pad. To connect to a pad, a larger opening is etched into an overlying dielectric layer, while to pass through a pad without connection, a narrower opening is etched into the overlying dielectric layer.

6 Claims, 9 Drawing Sheets

PASS THROUGH VIA TECHNOLOGY FOR USE DURING THE MANUFACTURE OF A SEMICONDUCTOR DEVICE

This is a divisional of U.S. Ser. No. 11/732,356 filed Apr. 3, 2007 and issued Mar. 3, 2009 as U.S. Pat. No. 7,498,260, which is a continuation of U.S. Ser. No. 10/925,796 filed Aug. 24, 2004 and issued Apr. 3, 2007 as U.S. Pat. No. 7,199,050.

FIELD OF THE INVENTION

This invention relates to the field of semiconductor manufacture and, more particularly, to a semiconductor device such as a stacked semiconductor device which may provide both a selective contact to one or more bond pads and a structure for passing a signal through a bond pad without connection to the bond pad.

BACKGROUND OF THE INVENTION

A common goal of semiconductor design engineers is to maximize the density of electronic circuitry in a given area. This may include forming elements such as an array of storage capacitors and transistors as small as possible on a semiconductor wafer, and miniaturizing packaging of a semiconductor die.

Many different methods to miniaturize packaging of semiconductor devices have been used. Early designs of dual in-line packages (DIP's) comprised an encapsulated die attached to a lead frame having through-hole leads which passed through holes in a printed circuit board (PCB) and were soldered on the back side of the PCB. Zigzag in-line packages (ZIP's) were developed which comprised an encapsulated die oriented vertically on its side with through-hole leads in an attempt to reduce the horizontal area required by DIP devices. Small outline 3-lead (SOJ) devices were developed which were surface mounted to the PCB. To decrease the vertical space required on the PCB, thin small outline packages (TSOP's) were developed which comprised a die which was background to thin the die and a much thinner encapsulation. Attempts have been made to eliminate encapsulation from the die altogether to form ct-lip-on-board (COB) devices (see, for example, U.S. Pat. No. 5,818,698) which connect an unencapsulated die directly to a PCB by using tape automated bonding (TAB), z-axis conductive polymer, or some other method. U.S. Pat. Nos. 5,138,434 and 6,320,253 discuss placing one or more unencapsulated devices in a socket which is attached to a printed circuit board.

Another way to reduce packaging is to stack semiconductor devices on top of each other. Attempts have been made to stack entire interconnected wafers (U.S. Pat. Nos. 5,229,647 and 5,714,802). One difficulty in stacking semiconductor devices is the interconnection of memory elements (wafers or singularized dice) from one wafer or wafer section to another. Often, a via is desired which passes through the wafer without connecting to circuitry on the wafer, and another is desired which connects to circuitry on the wafer, for example by connecting to a bond pad on the wafer. Forming these two interconnection types requires two or more processes. Each different process performed on a semiconductor increases costs due to increased production time, materials, and scrap.

Each of the patents listed above is assigned to Micron Technology, Inc. and is incorporated herein by reference as if set forth in its entirety.

A method for forming an interconnect for stacked semiconductor wafers or wafer sections (semiconductor dice) which allows two types of interconnects to be formed simultaneously would be desirable.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
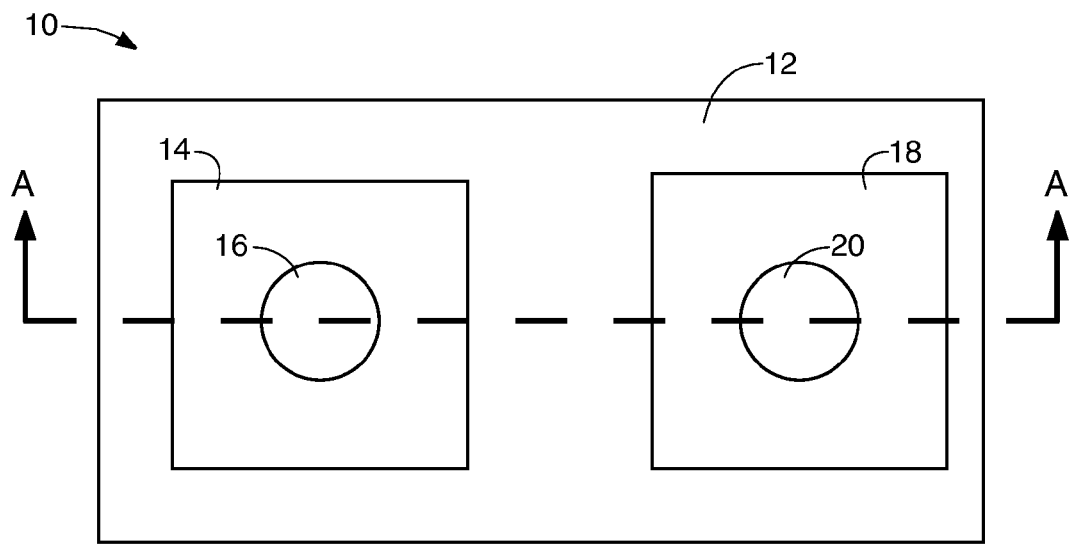
FIG. 1 is a plan view depicting first and second pads formed as part of a semiconductor wafer substrate assembly.
Figure 2:
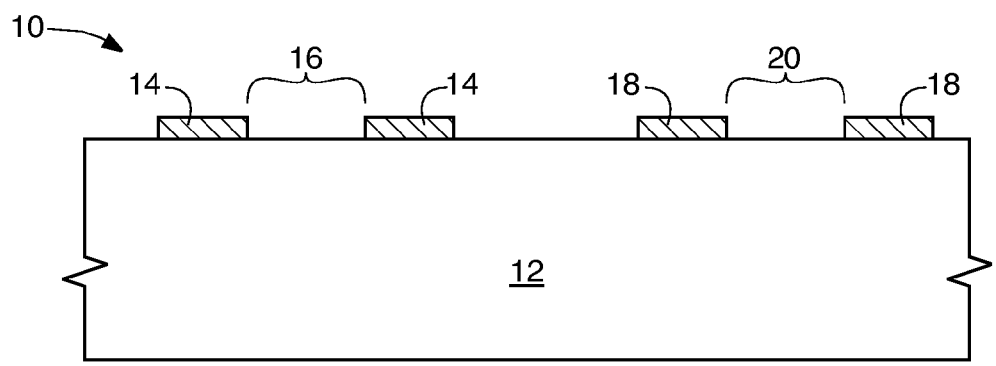
FIG. 2 depicts a cross section of the FIG. 1 structure.

A first embodiment of an inventive method to form a semiconductor device having conductive interconnects which pass through a semiconductor wafer substrate assembly is depicted in FIGS. 1-9, which also depict various inventive intermediate structures resulting from the method to form the device. FIG. 1 is a plan view, and FIG. 2 is a cross section at A-A of FIG. 1, of a portion of a starting structure which may be used with an embodiment of the present invention. FIGS. 1 and 2 depict a semiconductor wafer substrate assembly 10 comprising a semiconductor wafer 12, a first conductive pad 14 having a horizontal surface with an opening 16 therein, and a second conductive pad 18 having a horizontal surface with an opening 20 therein. The pads may be bond pads manufactured in accordance with the art from gold, aluminum, copper, or may be another type of conductive pad. Further, the pads are depicted in close proximity to each other on a semiconductor wafer although they may be located more remotely from each other. The process itself is independent of the pad pitch and pad shape, and the via is sized to meet the electrical performance requirements of the device.

It should be noted that process parameters such as chamber temperature, pressure, etc. will likely vary depending on the equipment used. These settings are easily determined by one of ordinary skill in the art for various equipment manufacturers and models. Further, specifics regarding various etch chemistries and equipment settings have been omitted as being known in the art from the description herein.

Figure 3:
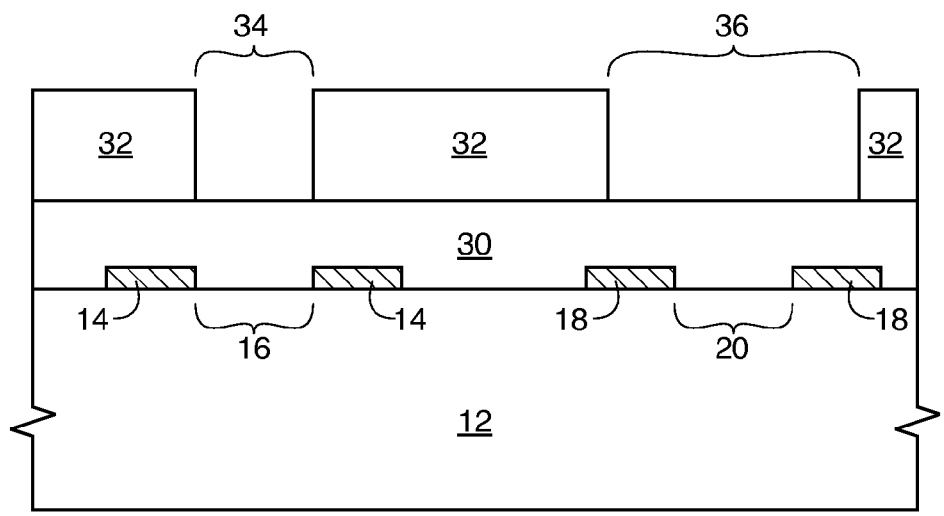
FIG. 3 depicts the FIG. 2 structure subsequent to forming a passivation layer and a patterned mask.

After forming the structure of FIGS. 1 and 2, a blanket dielectric passivation layer 30 is formed over the surface to cover the bond pads 18, then a patterned photoresist (resist) layer 32 is formed over the passivation layer as depicted in FIG. 3. The passivation layer may comprise a deposited layer of varying thicknesses of silicon dioxide (SiO2), silicon nitride (Si3N4), or another material which meets electrical performance requirements for a passivation layer. The patterned photoresist layer 32 comprises first 34 and second 36 openings therein which overlie the openings in the bond pads. The first, narrower opening 34 is formed over only the openings of any bond pad which is not to be electrically coupled with a conductive via which will eventually be formed within bond pad opening 16. These openings 34 in resist layer 32 may be the same size as the opening 16 in bond pad 14, or may be formed smaller than opening 16. Conversely, the second, wider opening 36 is formed over bond pads such as pad 18 which will be electrically coupled with a conductive via which will eventually be formed within bond pad opening 20. This opening 36 is the same size or smaller than the perimeter of bond pad 18, but larger than the opening 20 in the bond pad.

Figure 4:
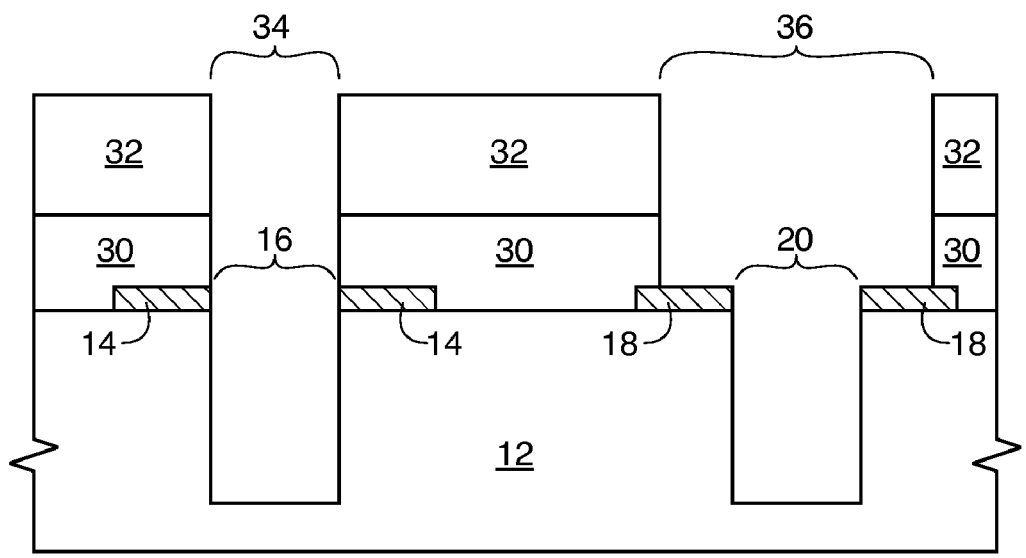
FIG. 4 depicts the FIG. 3 structure subsequent to etching the semiconductor wafer substrate assembly.

Next, an etch of the passivation 30 and the wafer 12 is performed to result in the FIG. 4 structure. This etch exposes pad 18 as depicted, preferably with no etching of the pad itself. Pad 14 is depicted as being exposed only along a vertical edge but may not be exposed at all if opening 34 is smaller than opening 16 in bond pad 14. The etch may extend only part way into the wafer 12, or it can etch completely through the wafer, depending on the desired final thickness of the wafer. Various etches which remove silicon selective to the bond pad material are known in the art, for example an etch comprising SF6 and/or C2F4.

Figure 5:
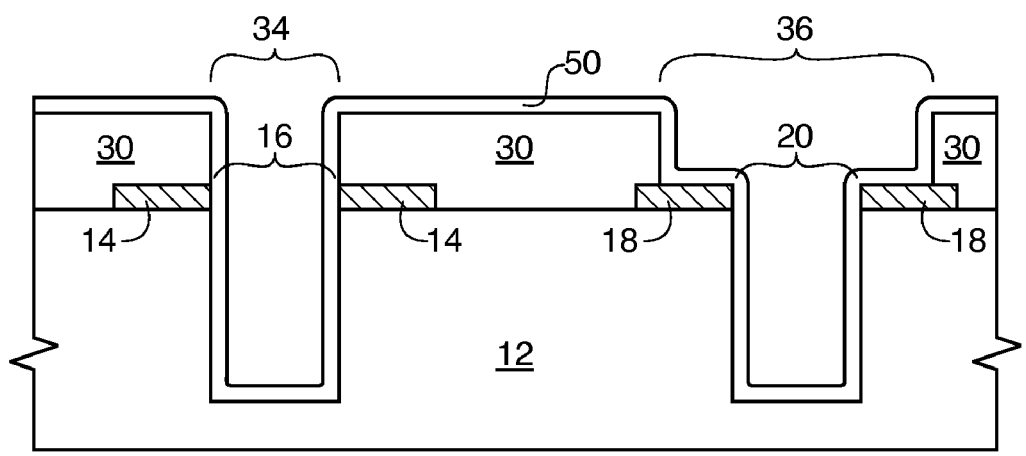
FIG. 5 depicts the FIG. 4 structure after forming a conformal dielectric layer over exposed surfaces.

Subsequent to etching the passivation layer 30 and the wafer 12 as depicted in FIG. 4, the resist is removed and a thin conformal dielectric layer 50, for example SiO2 such as tetraethyl orthosilicate (TEOS) or Si3N4, is formed over exposed surfaces as depicted in FIG. 5.

Figure 6:
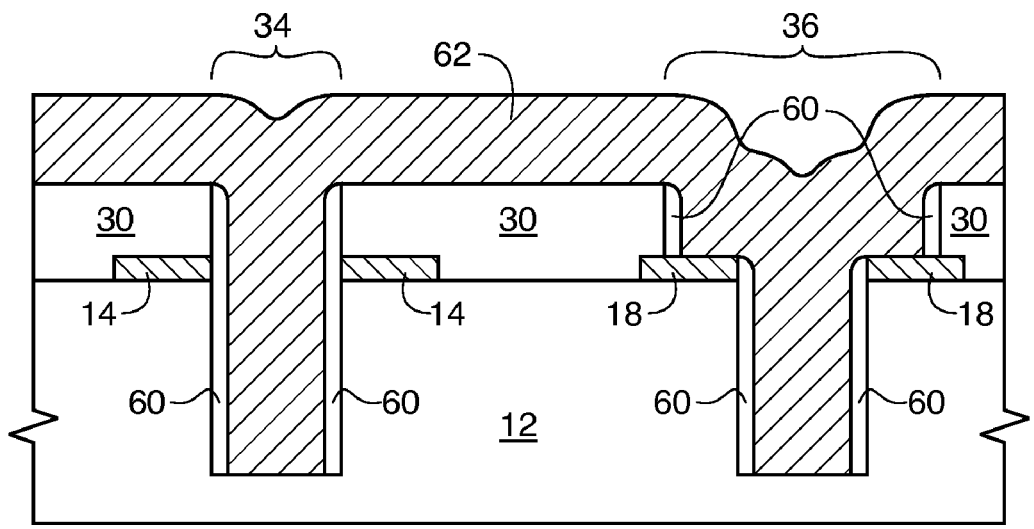
FIG. 6 depicts the FIG. 5 structure subsequent to a spacer etch and the formation of a conductive layer.

Next, a spacer etch is performed to remove the conformal dielectric layer 50 from horizontally-oriented surfaces and to leave spacers 60 as depicted in FIG. 6 over vertically-oriented surfaces.

It should be noted that the spacers within each opening are depicted as isolated first and second cross-sectional spacers, while they may be, in actuality, a single continuous spacer within each opening due to the openings being, typically, round, oval, square, or rectangular in shape. For purposes of this disclosure, spacers may be referred to as "first and second cross-sectional spacers" but may be two portions of one single continuous spacer.

Subsequent to forming spacers 60, a conductor 62 is formed over the surface of the assembly which fills the openings in the passivation layer, the bond pads, and the wafer. A conductive layer such as copper, nickel, tungsten, tantalum, gold, solder, or a combination of metals may be formed, preferably using chemical vapor deposition (CVD), plasma-enhanced CVD (PECVD), or plating.

Figure 7:
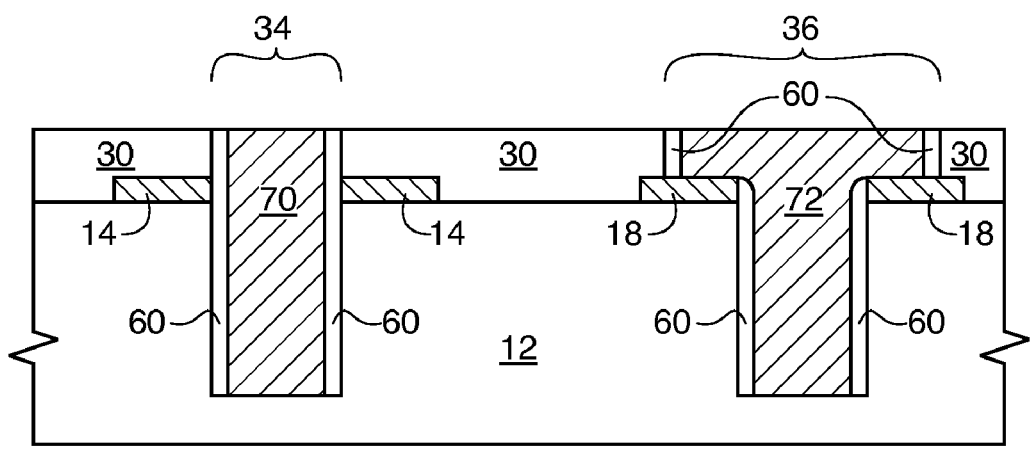
FIG. 7 depicts the FIG. 6 structure after an etch or planarization of the conductive layer.

The conductive layer 62 is then stripped, for example using an etch, mechanical planarization, or chemical mechanical planarization (CMP) to form the structure of FIG. 7 having plugs which are planarized and electrically isolated from each other, with a first plug 70 being formed within opening 34 and a second plug 72 being formed in opening 36. It should be noted that plug 70 is electrically isolated from pad 14 while plug 72 is electrically coupled with pad 18. During the planarization of conductive layer 62 to form plugs 70, 72, the passivation 30 has been slightly over etched to assure complete removal of the conductive layer from the horizontal portions of the assembly between the bond pads 14, 18.

Figure 8:
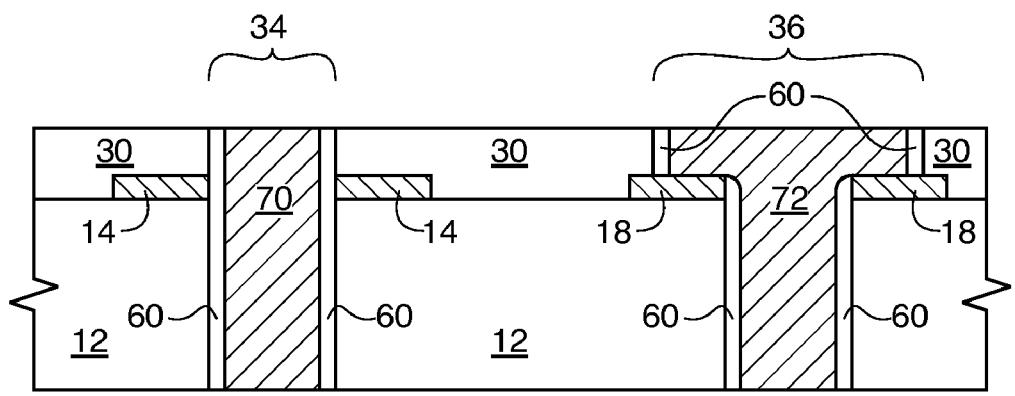
FIG. 8 depicts the FIG. 7 structure after performing an etch or back grind of the back side of the semiconductor wafer substrate assembly to expose the conductive layer from the back side of the assembly.

After planarizing conductive layer 62 to form plugs 70, 72 as depicted in FIG. 7, the back side of the wafer is etched or backgrounded to expose the plugs 70, 72 from the back side of the wafer as depicted in FIG. 8. At this point in the process the plugs become pass through vias, as they extend from the front of the wafer assembly to the back, and are available to pass a signal or voltage through the wafer. As described above, with this process the vias are selectively formed to contact the bond pads as desired using a single process which forms the vias simultaneously. As can be seen in FIG. 8, via 72 is in electrical contact with bond pad 18, while via 70 is not in electrical contact with plug 14, even though both vias were formed simultaneously. During the formation of stacked devices, this is useful to pass a signal or voltage through a wafer or wafer section without contacting the wafer itself, while it is desirable to form a contact to certain other pads. Alternately, it may be useful to connect a bond pad to a lead frame paddle or to another type of substrate to which the wafer section is attached.

Figure 9:
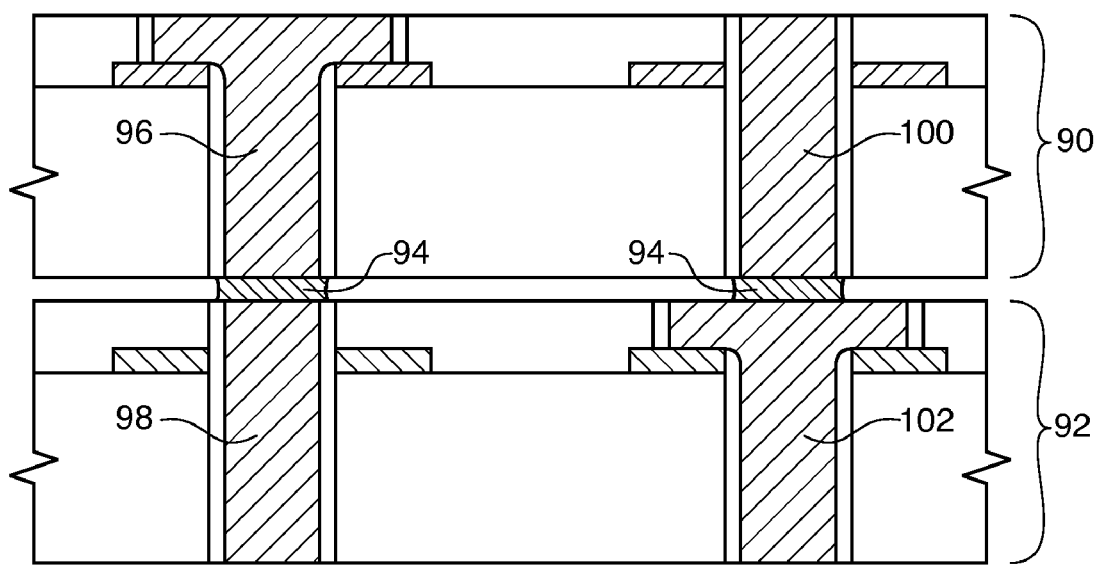
FIG. 9 depicts first and second stacked and electrically coupled semiconductor wafer substrate assemblies.

FIG. 9 depicts portions of a first semiconductor wafer substrate assembly 90 stacked on a second semiconductor wafer substrate assembly 92 and connected by a conductive material 94 such as conductive epoxy, metal, a z-axis conductor, or another workable material. Via 96 of assembly 90 is electrically coupled to via 98 of assembly 92, and via 100 of assembly 90 is electrically coupled to via 102 of assembly 92. FIG. 9 exemplifies just one of many possible arrangements. Further, the structure of FIG. 9 will likely comprise many other structural features and elements which are not immediately germane to the present embodiment of the invention and are not depicted.

FIGS. 3 and 10-16 depict a second embodiment of the invention for forming vias which pass through pads such as bond pads, wherein selected first vias are electrically coupled with pads through which they pass and other selected second vias are electrically isolated from pads through which they pass, with the first and second vias being formed simultaneously.

First, the structure of FIG. 3 is formed in accordance with the first embodiment, then a vertical anisotropic etch is performed which removes the exposed portions of the passivation layer 30 while leaving the bond pads 14, 18 and the semiconductor wafer 12 unetched. This results in the structure of FIG. 10. An etch which removes a SiO2 passivation layer 32 selective to the bond pad material and silicon is known in the art.

Figure 10:
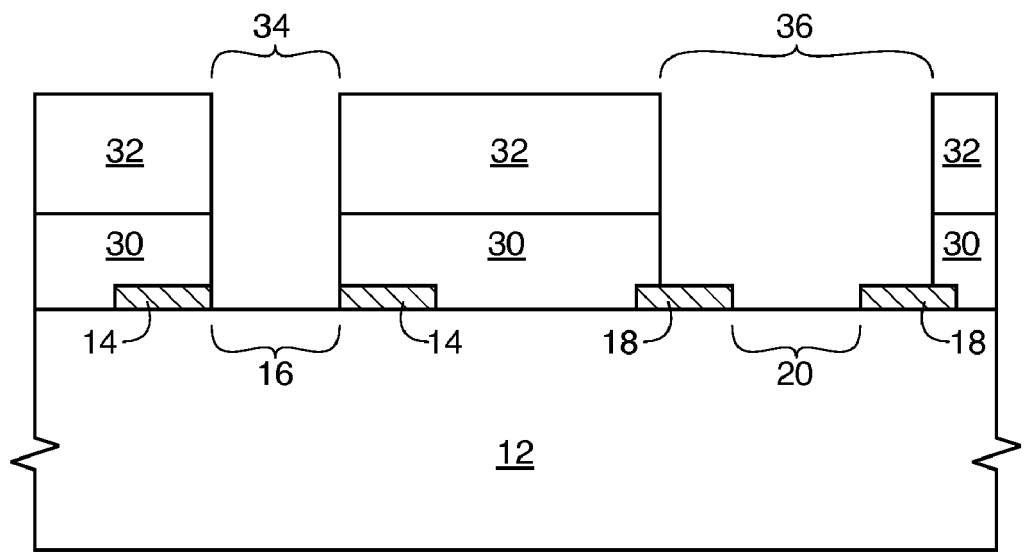
FIGS. 10-16 depict a second embodiment of the invention.
Figure 11:
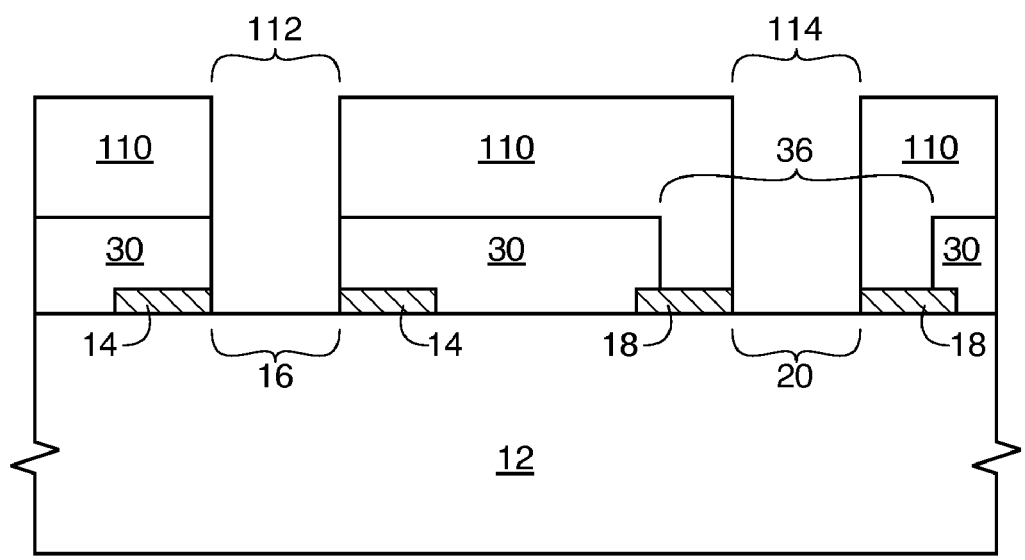
Figure 12:
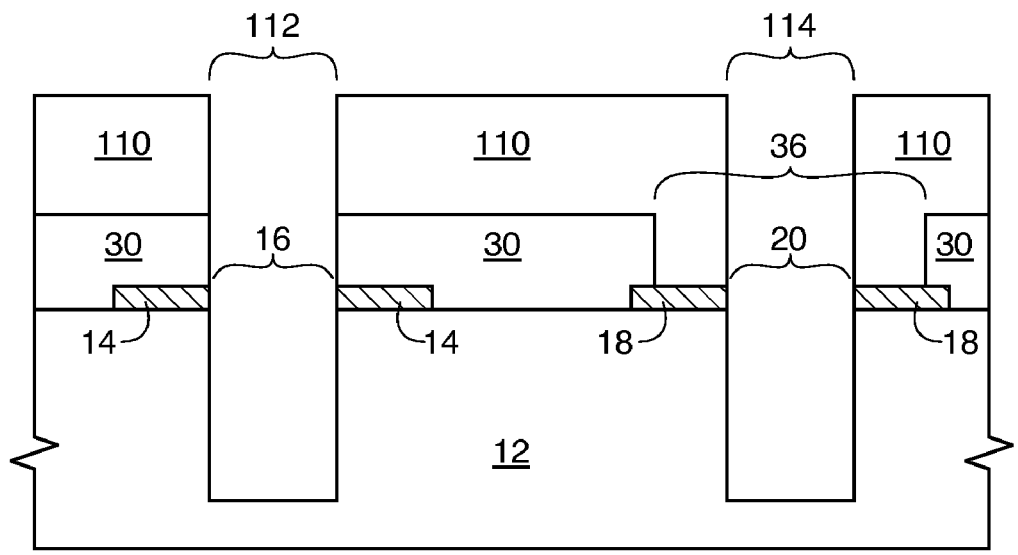
Figure 13:
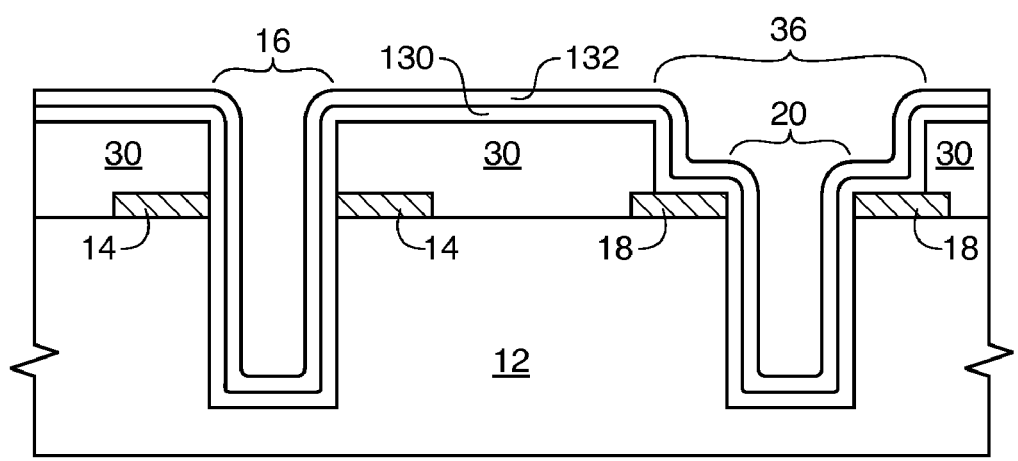

Next, the photoresist layer 32 of FIG. 10 is removed and another patterned photoresist layer 110 is formed as depicted in FIG. 11. Resist 110 provides first 112 and second 114 openings which expose the wafer substrate assembly 12 at the openings 16, 20 of the bond pads 14, 18. Each opening 112, 114 in resist 110 should be less than or equal to the size and shape of the openings 16, 20 in the bond pads 14, 18 so that the pads themselves are not exposed or are exposed only at their sidewalls. After forming the patterned resist 110 the substrate assembly 12 is partially etched with a vertical anisotropic etch to result in the structure of FIG. 12.

Figure 14:
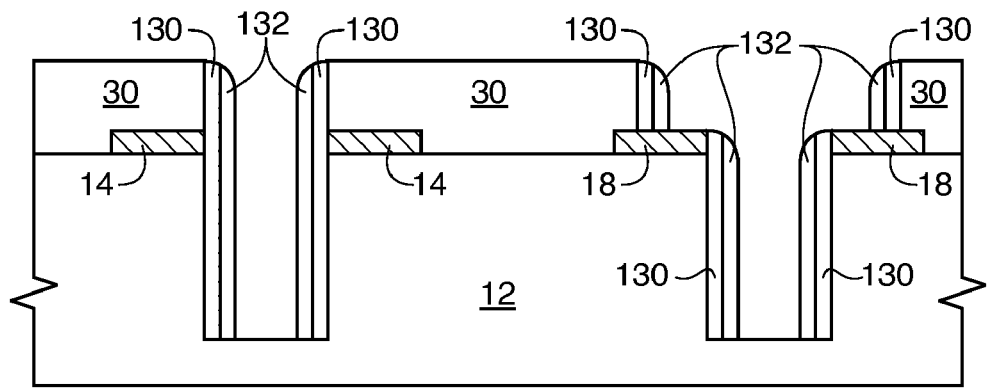

Subsequently, the resist 110 is removed and a thin, conformal dielectric layer 130 is formed over exposed surfaces, followed by a thin, conformal metal seed layer 132. For layer 130, a TEOS dielectric layer can easily be formed by one of ordinary skill in the art. A metal seed layer, for example a CVD tungsten layer can be formed by one of ordinary skill in the art to result in the structure of FIG. 13. Next, a vertical anisotropic (spacer) etch is performed to remove the insulation layer 130 and the seed layer 132 from horizontal surfaces as depicted in FIG. 14. The TEOS and tungsten seed layer may be removed with separate etches or with a single etch with minimal etching to the passivation layer 30, the bond pads 14, 18, and the wafer substrate assembly 12.

Figure 15:
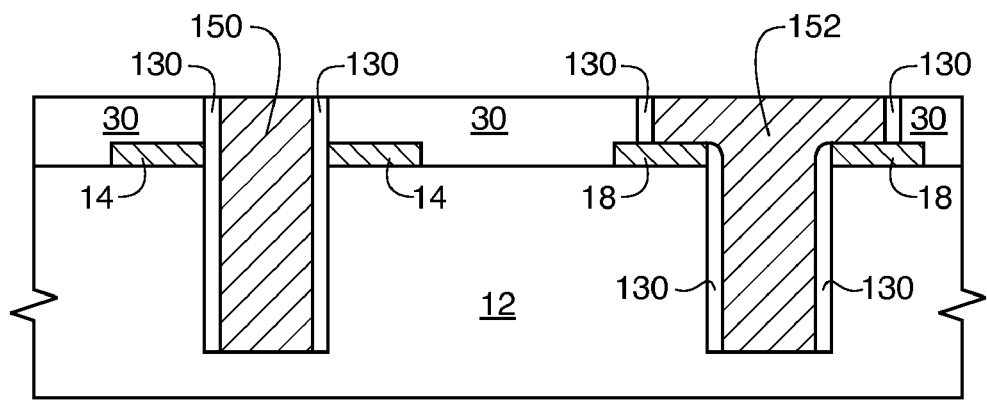

After forming the FIG. 14 structure, the seed layer 132 is used to grow a conductive layer within the openings which are lined by the seed layer to result in the structure of FIG. 15 having a first 150 and second 152 conductive vias. Even though the vias were formed simultaneously, the first via 150 is electrically isolated from bond pad 14 by dielectric layer 130, while the second via 152 electrically contacts bond pad 18.

Figure 16:
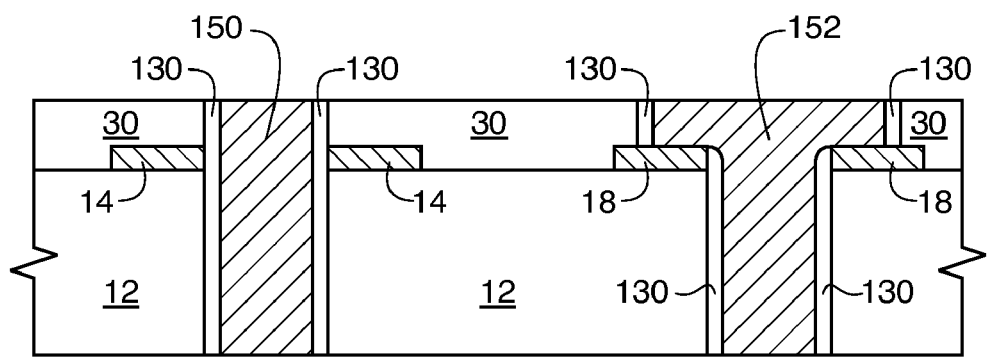

Finally, the wafer substrate assembly 12 is back ground or etched to expose vias 150, 152 from the back side of the wafer as depicted in FIG. 16. Two or more semiconductor wafers can be interconnected in a manner similar to that depicted in FIG. 9. In another embodiment, the wafers are first singularized using a wafer saw or some other means, then two or more wafer sections such as individual dice can be connected to result in a structure similar to that of FIG. 9.

Figure 17:
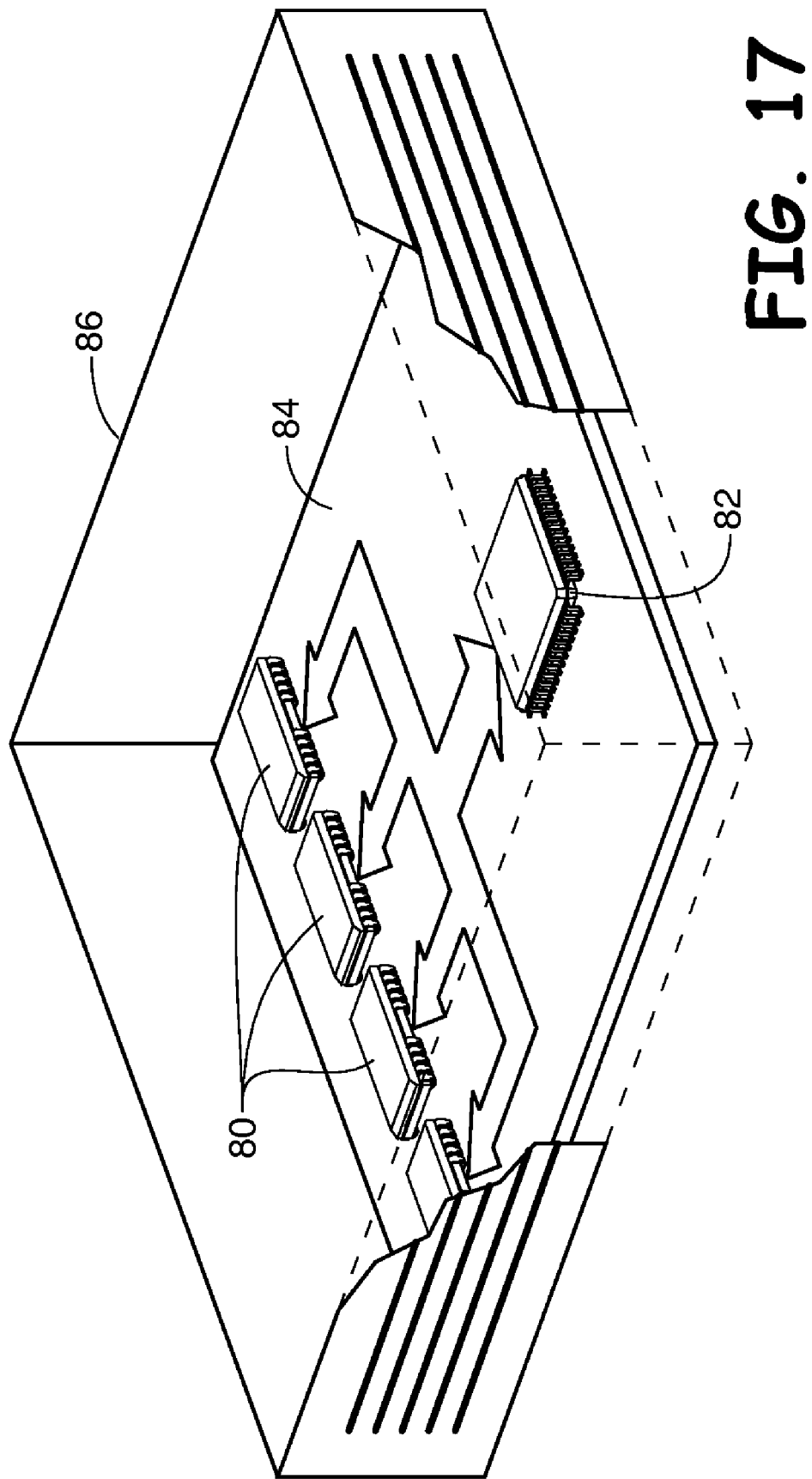
FIG. 17 is an isometric depiction of various components which may be manufactured using devices formed with an embodiment of the present invention.

As depicted in FIG. 17, a semiconductor device 170 formed in accordance with the invention may be attached along with other devices such as a microprocessor 172 to a printed circuit board 174, for example to a computer motherboard or as a part of a memory module used in a personal computer, a minicomputer, or a mainframe 176. FIG. 17 may also represent use of device 170 in other electronic devices comprising a housing 176, for example devices comprising a microprocessor 172, related to telecommunications, the automobile industry, semiconductor test and manufacturing equipment, consumer electronics, or virtually any piece of consumer or industrial electronic equipment.

Figure 18:
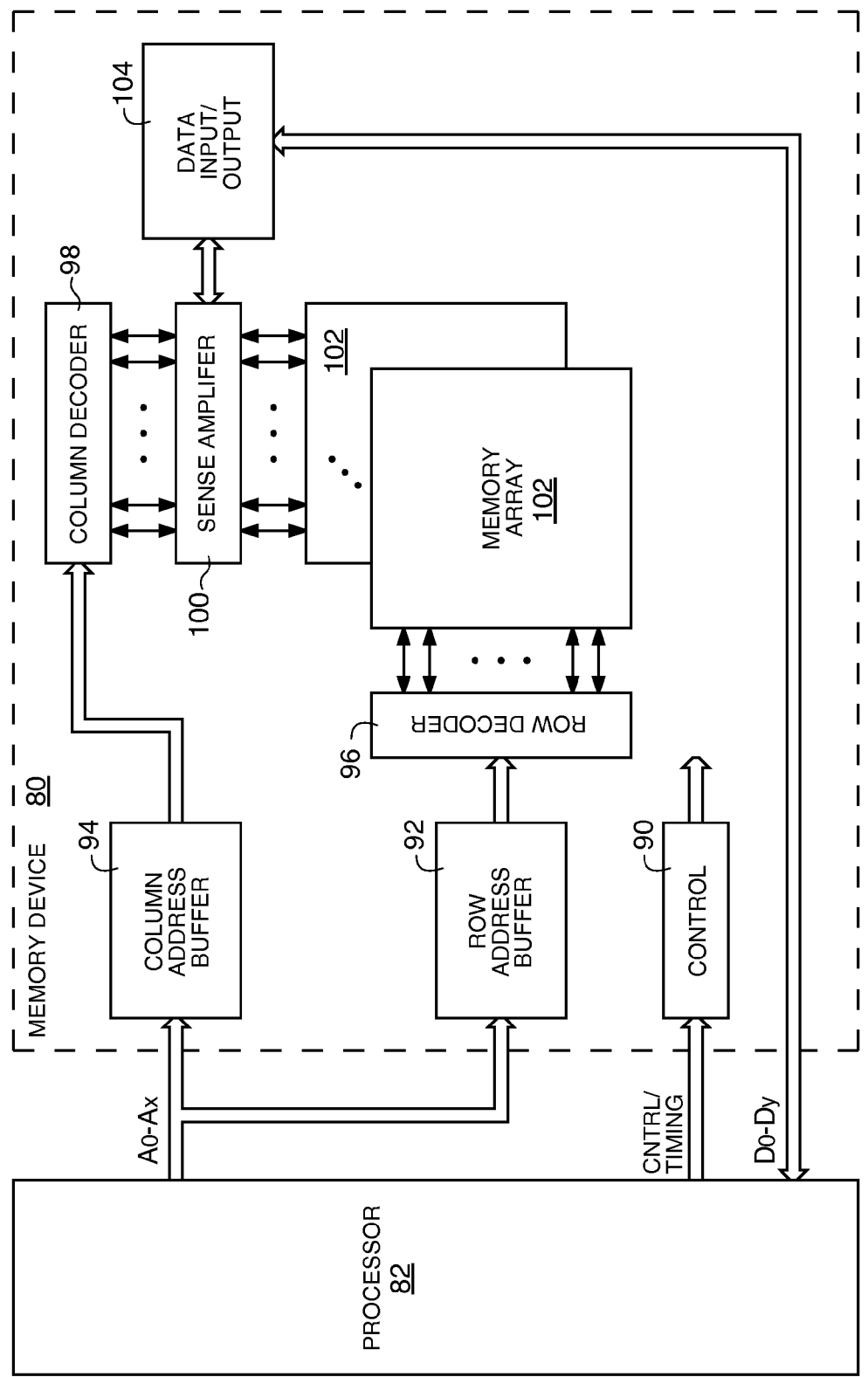
FIG. 18 is a block diagram of an exemplary use of the invention to form part of a memory device having a storage transistor array.

The process and structure described herein can be used to manufacture a number of different structures which comprise a structure formed using a photolithographic process. FIG. 18, for example, is a simplified block diagram of a memory device such as a dynamic random access memory having features which may be formed using an embodiment of the present invention. The general operation of such a device is known to one skilled in the art. FIG. 18 depicts a processor 172 coupled to a memory device 170, and further depicts the following basic sections of a memory integrated circuit: control circuitry 184; row 186 and column 188 address buffers; row 190 and column 192 decoders; sense amplifiers 194; memory array 196; and data input/output 198.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising:
   a first opening through a first conductive pad and a second opening through a second conductive pad, wherein the first and second openings have about the same width;
   a dielectric material over the first and second conductive pads having a third opening which overlies the first opening in the first conductive pad and having a width about the same as the first opening in the first conductive pad and a fourth opening which overlies the second opening in the second conductive pad having a width which is larger than the second opening in the second conductive pad;
   a conductive material within the first and second openings of the first and second conductive pads and the third and fourth openings of the dielectric material such that the conductive material is electrically coupled with a top surface of the second conductive pad and is electrically isolated from the first conductive pad; and
   a dielectric spacer on a vertically oriented sidewall of the first and third openings and on a vertically oriented sidewall of the second and fourth openings.

2. A semiconductor device comprising:
   a first and second conductive pad over a semiconductor substrate;
   a dielectric material over the first and second conductive pad;
   a first opening through the semiconductor substrate, the first conductive pad and the dielectric material, such that the first opening is about the same width through the semiconductor substrate, the first conductive pad and the dielectric material;
   a second opening through the second conductive pad and dielectric material with a lower portion through the semiconductor substrate that is about the same width as the first opening and an upper portion through the dielectric material which has a larger width than the first opening; and
   a dielectric spacer on a vertically oriented sidewall of the first opening and on a vertically oriented sidewall of the second opening.

3. A semiconductor device having a top and bottom surface comprising:
   a semiconductor device having first and second openings extending through the semiconductor device;
   a first conductive pad overlying the first opening of the semiconductor device and having an opening therein, and a second conductive pad overlying the second opening of the semiconductor wafer and having an opening therein;
   a conductive material which provides a first conductive plug within the first opening in the semiconductor device and within the opening in the first conductive pad, wherein the first conductive plug is electrically isolated from the first conductive pad;

a conductive material which provides a second conductive plug within the second opening in the semiconductor device and within the opening in the second conductive pad, wherein the second conductive plug is electrically connected to the second conductive pad;

a first dielectric spacer within the first opening which separate the first conductive plug from the vertical sidewalls of the first conductive pad and a second dielectric spacer with in the second opening which separate the second conductive plug from the vertical sidewalls of the second conductive pad.

4. The semiconductor device of claim 3 further comprising:

a dielectric layer having a first and second openings therein, wherein the first opening in the dielectric layer overlies the opening in the first conductive pad and the second opening in the dielectric layer overlies the opening in the second conductive pad, and a diameter of the first opening in the dielectric layer is equal to or less than a diameter of the opening in the first conductive pad and a diameter of the second opening in the dielectric layer is greater than a diameter of the opening in the second conductive pad; and a first conductive plug is provided within the first opening in the dielectric layer and the second conductive plug is provided within the second opening in the dielectric layer.

5. The semiconductor device of claim 3 further comprising the first and second conductive plugs extending through the semiconductor device.

6. A semiconductor device having top and bottom surfaces, the semiconductor device comprising:

first and second electrically conductive pads located vertically between the top and bottom surfaces of the semiconductor device, wherein the first and second electrically conductive pads are laterally spaced apart;

a first opening passing through the semiconductor device from the top surface to the bottom surface, wherein the first opening passes through the first electrically conductive pad;

a first dielectric spacer lining a surface of the first opening, wherein the first dielectric spacer extends from the top surface to the bottom surface of the semiconductor device;

a first electrically conductive plug located within the lined first opening and exposed on the top surface and the bottom surface of the semiconductor device, wherein the first electrically conductive plug is electrically isolated from the first electrically conductive pad;

a second opening passing through the semiconductor device from the top surface to the bottom surface, wherein the second opening passes through the second electrically conductive pad;

a second dielectric spacer lining a surface of the second opening, wherein the second dielectric spacer extends from a top of the second electrically conductive pad to the bottom surface of the semiconductor device; and a second electrically conductive plug located within the lined second opening and exposed on the top surface and the bottom surface of the semiconductor device, wherein the second electrically conductive plug includes a stepped profile that overlaps and physically contacts the top surface of the second conductive pad to provide an electrical connection to the second electrically conductive pad.

* * * * *

UNITED STATES PATENT AND TRADEMARK OFFICE
CERTIFICATE OF CORRECTION

PATENT NO. : 7,791,207 B2
APPLICATION NO. : 12/396583
DATED : September 7, 2010
INVENTOR(S) : William M. Hiatt It is certified that error appears in the above-identified patent and that said Letters Patent is hereby corrected as shown below:

On the Title page, in Item (73), in "Assignee", in column 1, line 1, delete "Bosie," and insert -- Boise, --, therefor.

Signed and Sealed this

Seventh Day of December, 2010

David J. Kappos
*Director of the United States Patent and Trademark Office*